(12) United States Patent  (10) Patent No.: US 8,031,471 B2
Schmitt  (45) Date of Patent: Oct. 4, 2011

(54) SECURE TRANSPARENT ENCLOSURE FOR COMMUNICATION DEVICE

(75) Inventor: Robert J. Schmitt, Excelsior, MN (US)

(73) Assignee: Just Encase Products, Inc., Excelsior, MN (US)

( * ) Notice: Subject to any disclaimer, the term of this patent is extended or adjusted under 35 U.S.C. 154(b) by 504 days.

(21) Appl. No.: 12/317,205

(22) Filed: Dec. 19, 2008

(65) Prior Publication Data

US 2010/0157528 A1 Jun. 24, 2010

(51) Int. Cl.
 *G06F 1/16* (2006.01)
(52) U.S. Cl. .................... 361/730; 361/679.01
(58) Field of Classification Search .......... 361/730, 361/679.01
 See application file for complete search history.

(56) References Cited

U.S. PATENT DOCUMENTS

| | | | | |
|---|---|---|---|---|
| 4,289,361 | A * | 9/1981 | Riedel | 312/100 |
| 5,568,362 | A * | 10/1996 | Hansson | 361/736 |
| 6,348,655 | B1 * | 2/2002 | Wright | 174/50 |
| 6,381,126 | B1 | 4/2002 | Yoshimoto et al. | |
| 6,519,208 | B2 * | 2/2003 | DeVries | 368/10 |
| 6,762,360 | B2 * | 7/2004 | Wright | 174/50 |
| 6,809,254 | B2 | 10/2004 | Clement et al. | |
| 6,914,744 | B1 | 7/2005 | Wang | |
| 6,979,777 | B2 * | 12/2005 | Marcou et al. | 174/50 |
| D514,096 | S | 1/2006 | Storti et al. | |
| 7,069,063 | B2 | 6/2006 | Halkosaari et al. | |
| 7,255,640 | B2 * | 8/2007 | Aldag et al. | 454/184 |
| 7,572,975 | B2 * | 8/2009 | Ruihley | 174/50 |
| 7,737,360 | B2 * | 6/2010 | Wiemeyer et al. | 174/50 |
| 7,744,170 | B1 * | 6/2010 | Rutler | 312/102 |
| 7,918,362 | B2 * | 4/2011 | Schmitt | 220/665 |
| 7,943,850 | B2 * | 5/2011 | Leopold et al. | 174/50 |
| 7,947,901 | B2 * | 5/2011 | Leopold | 174/50 |
| 2010/0008028 | A1 * | 1/2010 | Richardson et al. | 361/679.01 |

* cited by examiner

*Primary Examiner* — Lisa Lea Edmonds
(74) *Attorney, Agent, or Firm* — Kinney & Lange, P.A.

(57) ABSTRACT

An enclosure comprises first and second sections formed of a transparent material, a plurality of wall sections, a plurality of vent holes, a hinge, a cable access and a lock. The wall sections are joined to the first section to form the enclosure. The vent holes are formed in the wall sections to provide thermal flow through the enclosure. The hinge connects the second section to one of the plurality of wall sections to form a door in the enclosure. The cable access is located to allow authorized power and data connections within the enclosure when the door is in an open position, and sized to prevent unauthorized data connections within the enclosure when the door is in a closed position. The lock secures the enclosure by locking the door in the closed position.

16 Claims, 5 Drawing Sheets

SECURE TRANSPARENT ENCLOSURE FOR COMMUNICATION DEVICE

BACKGROUND OF THE INVENTION

This invention relates generally to electronics enclosures, and specifically to enclosures for internet-based communication hardware. In particular, the invention concerns an enclosure for communication devices used to perform secure internet-based transactions, including secure online and retail transactions.

The rapid emergence of the internet coincides with a new era in the retail economy, in which increased access and flexibility have fundamentally altered traditional forms of financial transaction. The effects impact not only the online business community, but also traditional bricks-and-mortar retailers. In particular, credit, debit and check purchases have rapidly evolved from a traditional paper-based format with periodic accounting, into an online system based on prompt electronic verification and real-time funds transfer.

While these changes provide substantial benefits, internet-based transactions also pose new challenges in the areas of security and loss prevention. This is a particular issue for switches, modems, servers, and other electronic communication devices. Traditionally, these electronic security issues have been addressed by a range of hardware and software-based solutions, including improved firewalls, more secure server devices, and better encryption for account information and other high-risk data. Nonetheless, instances of improper and unauthorized access remain a problem. The consequences range from minor economic costs due to lost bandwidth, to potentially serious liability for illegal or offensive downloading, fraudulent transactions and identity theft.

Each time a consumer's account and billing data are transmitted over the internet, for example, provides an additional opportunity for improper access. This opportunity is met by aggressive efforts to circumvent existing safety measures and exploit loopholes, making identify theft and other internet-based economic offenses a primary security concern. In general, aggressive countermeasures rapidly close gaps once they have been exposed, but sometimes the damage has already been done. Even when best security practices are employed, moreover, the incentives are high and the risk-to-reward ratio for criminal behavior can be low.

This creates an ongoing need for additional approaches to internet transaction security. In particular, there is a need for cost-effective techniques that complement existing procedures, can easily be integrated into existing web-based security system designs, and are adaptable to a range of traditional bricks-and-mortar retail environments, online or virtual storefronts, and other commercial enterprises.

BRIEF SUMMARY OF THE INVENTION

This invention is directed to a transparent secure enclosure, and to a system using the enclosure to secure a communications device. The enclosure has first and second sections formed of a transparent material, and a plurality of wall sections joined to the first section to form the enclosure. Vent holes are formed in the wall sections, in order to provide thermal flow through the enclosure. The second section is connected to one of the plurality of wall sections with a hinge to form a door. A cable access is located in the enclosure to allow authorized power and data connections when the door is open, and sized to prevent unauthorized data connections when the door is closed. A lock secures the enclosure by locking the door in the closed position.

DETAILED DESCRIPTION

Figure 1A:
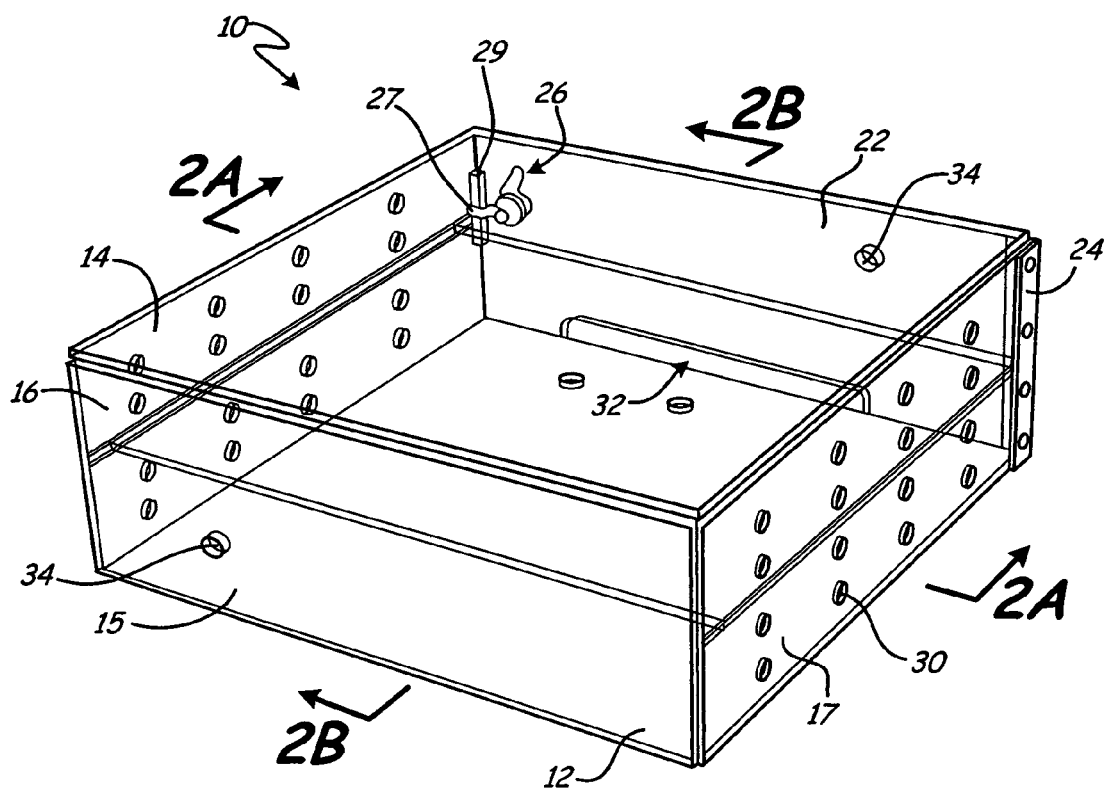
FIG. 1A is a front perspective view of a secure transparent enclosure for a communication device.
Figure 1B:
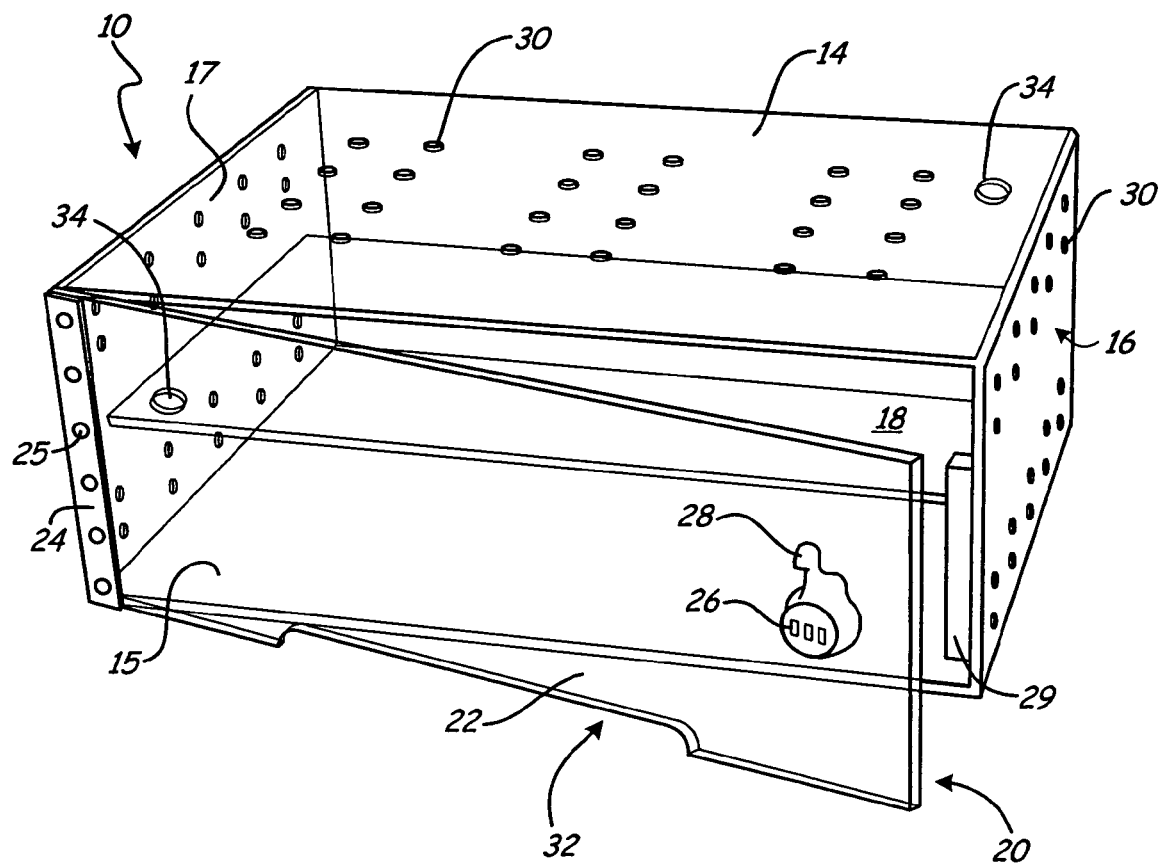
FIG. 1B is a rear perspective view of the enclosure in FIG. 1A.

FIGS. 1A and 1B are front and rear perspective views, respectively, of secure transparent enclosure 10. Enclosure 10 comprises first transparent panel 12, wall panels 14-17, and, in some embodiments, internal divider 18. Door 20 is formed on enclosure 10 by attaching second transparent panel 22 to one of wall panels 14-17, opposite first panel 12, using hinge 24. Lock 26 secures door 20 in a closed position, in order to prevent unauthorized access to routers, switches, modems, firewalls, switches and other electronic communication devices inside enclosure 10.

Individual panels or enclosure sections 12, 14-18 and 22 are formed from lightweight, durable and electrically insulating materials such as thermoplastic polymers. At least panels 12 and 22 are transparent, in order to provide internal views of the communication device or devices secured within enclosure 10. Typically, wall panels 14-17 and divider panel 18 are also transparent, in order to simplify construction and to provide additional interior views. Alternatively, one or more of wall panels 14-17 and divider panel 18 are opaque.

Transparent panels such as first and second transparent panels 12 and 22 allow sufficient light to pass through so that communication devices can be seen inside enclosure 10. In particular, transparent panel materials encompass both optically clear materials, which absorb little visible light, and translucent or semi-transparent materials, which are partially absorbent but transmit sufficient light to verify the location, cabling configuration and operational condition of the communication device or devices inside enclosure 10.

The geometrical designations of individual panels 12, 14-18 and 22 depend upon the orientation and configuration of enclosure 10. In the particular embodiment of FIGS. 1A and 1B, for example, first transparent panel 12 is located at the front of enclosure 10, and wall panels 14-17 are attached to first panel 12 to form a top (panel 14), bottom (panel 15) and two sides (panels 16 and 17). Divider 18 is supported by side panels 16 and 17 to form a horizontal divider or shelf, and second transparent panel 22 is attached to side panel 17 to form door 20 at the rear of enclosure 10. Alternatively, first transparent panel 12 is a top, bottom, side or back panel, and the designations of wall panels 14-17 and door panel 22 vary accordingly. In some of these embodiments, for example, divider panel 18 forms a vertical divider, rather than a horizontal shelf, and is attached to top and bottom panels rather than side panels.

Lock 26 typically comprises a keyless locking mechanism such as a three-dial cam lock with cam stop 27 and door pull 28. In alternate embodiments, lock 26 comprises a combination lock with sequential action, a mechanical pushbutton lock, or, alternatively a keyed locking mechanism such as a keyed cylinder lock or padlock, or utilizes an alternate locking configuration such as a bolt or hasp.

Door pull 28 or a similar means is used to open and close door 20 when not secured by lock 26. In some embodiments, for example, door pull 28 is shaped as a finger pull, as shown in FIGS. 1A and 1B, and in other embodiments door pull 28 takes the form of a knob or handle. In further other embodiments lock 26 is shaped for use as an opener, and incorporates door pull 28.

Lock 26 secures enclosure 10 by locking door 20 in a closed position, for instance by rotating cam stop 27 behind door stop 29. Door stop 29 is formed of the same or similar material as are used for panels 12, 14-18 and 22. Door stop 29 is typically attached to enclosure 10 opposite hinge 24.

Ventilation holes (or vent holes) 30 are typically round openings, as shown in FIGS. 1A and 1B, but are sometimes formed as ovals, slots, rectangles, or other shapes. Ventilation holes 30 are formed by cutting, drilling, machining or molding any combination of front, top, bottom and side panels 14-17, shelf/divider panel 18 and door panel 22. In some embodiments, for example, ventilation holes 30 are formed in side panels 16 and 17, as shown in FIG. 1A, and in other embodiments ventilations holes 30 are also formed in top panel 14, as shown in FIG. 1B. In further embodiments, ventilation holes 30 are formed in one or more of bottom panel 15, shelf/divider panel 18 and door panel 22.

Ventilation holes 30 are sized and located to generate ventilation and thermal fluid flow through enclosure 10, in order to maintain desirable ranges of operating temperature and humidity. Typically the flow is a convective flow of air or another thermally conductive fluid, but in some embodiments a small box fan or other device is used to increase the flow rate. The size and spacing of ventilation holes 30 is further selected such that the strength of panels 14-18 and 22 is not materially impaired.

Cable access 32 is formed similarly to vent holes 30. Cable access 32 typically forms an oblong or semicircular opening or slot, a number of such slots and openings, in door 20, for instance in or adjacent to door panel 22. Authorized data and power connections are made with door 20 in an open position, using cable access 32 as a feed-through located in for routing the required cables into enclosure 10. Door 20 is then closed and locked, securing enclosure 10 by physically preventing additional (unauthorized) connections. In particular, cable access 32 is sized to prevent unauthorized data connections to unused or auxiliary ports when door 20 is closed, by preventing the entry of standard data cable connectors as described below.

A number of control access apertures 34 are also formed in enclosure 10, typically but not necessarily in front panel 12 or door panel 22. Each control access 34 is positioned to provide access to an on/off switch or other control mechanism inside enclosure 10, for instance by using a stylus or other relatively small object to manipulate the control mechanism for on/off and boot/reboot control functionality (see, e.g., FIGS. 3A and 3B), or for additional control functions such as changing a bit rate, polarity or encoding scheme.

Similarly to cable access 32, control access apertures 34 (and vent holes 30) are located and sized to prevent unauthorized data connections using standard data connectors. The connectors contemplated by enclosure 10 include, but are not limited to, connectors for 10/100 and 10/100/1000 Base-T and Base-T4 cables, two-pin, four-pin, six-pin and eight-pin jacks for phone, headset and switch or modem-type connectors; RJ9, RJ10, RJ11, RJ14, RJ22, RJ25, RJ45, RJ49 or RJ61 connectors for crossed network cables and other modular device cables; D-subminiature (DA, DB, DC, DD and DE) connectors for RS-232 and related applications; and USB-type (universal service bus) connectors for personal electronic devices such as phones, cameras, personal computers and PDAs (personal digital assistants).

Enclosure 10 prevents unauthorized access to the internet and other communication services, lowering bandwidth-related costs, increasing productivity and reducing the potential liability related to activities such as illegal file sharing and accessing proprietary, protected or offensive materials. Enclosure 10 also reduces the risk of fraudulent transactions and identity theft in order to meet particular Payment Card Industry Data Security Standards (PCI DSS) requirements, as described in more detail with respect to the particular embodiments and communication devices shown in FIGS. 3A and 3B, below.

Figure 2A:
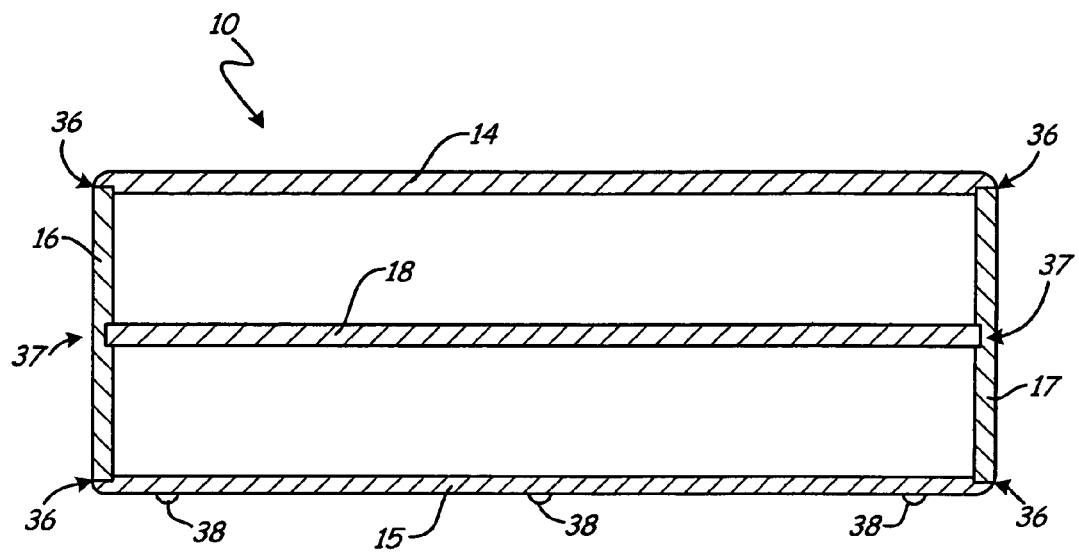
FIG. 2A is a front cross-sectional view of the enclosure in FIG. 1A, showing construction details.
Figure 2B:
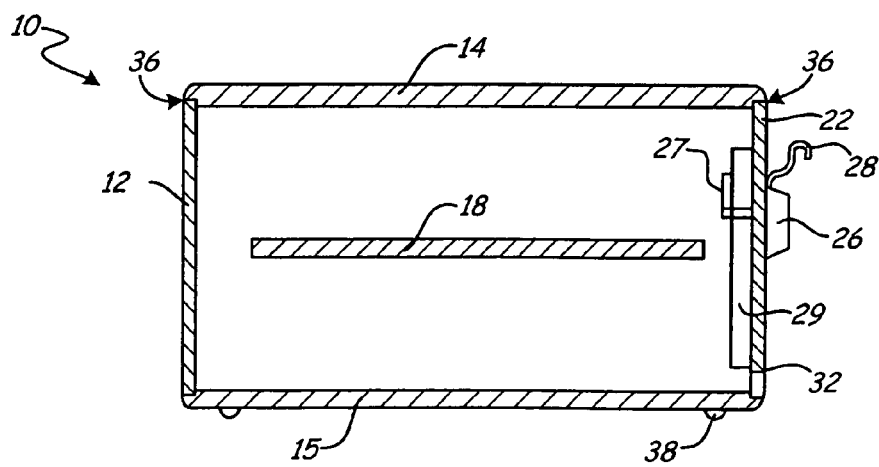
FIG. 2B is a side cross-sectional view of the enclosure in FIG. 2A.

FIGS. 2A and 2B are cross-sectional views of enclosure 10, taken along lines 2A-2A and 2B-2B of FIG. 1A. In these embodiments, panels 14-17 are joined by means of rabbet joints 36 to form the top, bottom and sides of enclosure 10. Divider panel 18 forms a horizontal shelf supported by side panels 16 and 17 using dado joints 38, and door stop 29 is attached to side panel 17, so that lock 26 secures door panel 22 in a closed position opposite front panel 12.

Enclosure sections 12, 14-18 and 22 are each formed of lightweight, durable and machinable materials such as plastic polymers and transparent thermoplastics. In contrast to other standard secure electronics enclosures, which are typically formed of metal, the materials of panels 12, 14-18 and 22 are electrically insulating polymers. This avoids a number of issues associated with metal construction, including machining costs and required electrical grounding structures. In addition, at least front panel 12 and door panel 22 are transparent or translucent, in order to provide internal views. This also contrasts with standard secure electronic enclosure design, in which internal devices are shielded from view by the use of opaque materials.

Suitable materials for panels 12, 14-18 and 22 include bisphenol A-based polycarbonate resin thermoplastics, as available under various trade names including Lexan®, from GE Plastics of Pittsfield, Mass.; Calibre®, from Dow Chemical of Midland, Mich.; and Panlite®, from Teijin Chemicals of Tokyo, Japan. Polycarbonate panels typically include a scratch-resistant coating, such as a Margard® coating from GE Plastics, or a separate protective layer such as SCLARL 150, from 3M Corporation of Saint Paul, Minn. Suitable acrylic-based polymethyl methacrylate or PMMA materials are available under trade names including Plexiglas®, from Arkema Corporation of Philadelphia, Pa. and Lucite® or Perspex®, from Lucite International of Cordova, Tenn. Suitable polyethylene terephthalate (PET) materials include Vivek,® a glycol-modified PET materials (PETG) available from Sheffield Plastics, Inc. a Bayer Materials Science Company located in Sheffield, Mass.

Polycarbonates are typically somewhat more expensive than acrylics, but polycarbonates are also stronger and highly transparent to visible light. PETG materials have many of the advantages of polycarbonate, and are sometimes available at somewhat lower cost. A variety of tints, colors, pigments, neutral shades, partially mirrored surfaces and non-reflective coatings are also added to the transparent thermoplastic panel material in order to modify the transmission and reflective properties of enclosure 10.

Enclosure sections 12, 14-18 and 22 are typically cut into panels from a sheet of polycarbonate, PETG, acrylic or other suitable material, with thickness T between about three and ten millimeters (3-10 mm, 0.118"-0.394", or about ⅛"-⅜"). Individual panel dimensions are determined to accommodate the outside dimensions of particular electronics devices, such as the router and modem shown in FIGS. 3A and 3B, below. Panel dimensions also include joint tolerances or about half the panel thickness for joining the panels together, and a spacing/airflow tolerance of up to 2-3 inches (about 5-8 cm) for thermal flow, to accommodate variations in the size of individual communication devices, and up to six inches (about 15 cm) to accommodate replacement or upgrade with larger or smaller devices.

For relatively small-scale router, switch and modem enclosures, panels 12, 14-18 and 22 typically range in length and width from about 4-6 inches (10-15 cm) to about 12-18 inches (30-45 cm), and in height from about 4-6 inches (10-15 cm) to about 10-12 inches (25-30 cm), particular enclosure dimensions also depend upon the number of devices secured within enclosure 10, and whether divider 18 is embodied as a horizontal shelf, a vertical divider, or is not used.

Panels 12 and 14-17 are typically assembled to form a right rectangular structure with approximately perpendicular sides, but other geometries such as trapezoids and oblong or rounded shapes are also included. In the particular embodiment of FIGS. 2A and 2B, top and bottom panels 14 and 15 are joined to side panels 16 and 17 by means of rabbet joints 36, forming a right rectangular structure. Divider panel 18 is oriented in a horizontal orientation between side panels 16 and 17, forming a shelf supported by dado joints 37.

Rabbet joints 36 and dado joints 37 are formed by routing, cutting or milling panels 12 and 14-18 at sufficient depth to accommodate the joined panel width, typically with a joint tolerance of about half the panel thickness. Joints 36 and 37 are secured using glue, epoxy or other adhesives, which are applied either by pre-gluing, dipping or by capillary action. Door stop 29 is formed similarly to panels 12, 14-18 and 22, and similarly attached to a wall panel such as side panel 17.

In alternate embodiments, butt joints, mitered rabbet joints or other joint structures are employed in the construction of enclosure 10, or panels 12, 14-18 and 22 and door stop 29 are mechanically attached, for instance by using screws, bolts, brads, pins or similar mechanical fasteners. In further embodiments, selected combinations of panels 12, 14-18 and 22 are formed as a single unit, for instance by molding or co-extrusion.

The exposed edges of enclosure 10 are typically rounded by milling, routing, cutting, sanding, or other technique. Rounding eliminates sharp corners, and provides aesthetic benefits. Depending upon configuration and order of construction, rounding is sometimes performed before the assembly of individual panels, and sometimes after.

In some embodiments, feet 38 are glued or otherwise attached to enclosure 10, for instance on the outside (bottom) surface of bottom panel 15. Feet 38 take a number of forms, including soft plastic or rubber structures such as Bumpons®, as available from 3M Corporation of Saint Paul, Minn.

Hinge 24 is typically formed from a resilient, flexible and fatigue-resistant polymer such as polypropylene, forming a continuous living hinge structure that extends along most or all of door panel 22 where it attaches to side panel 16. In living hinge embodiments, hinge 24 is cut to length, folded longitudinally, and mechanically attached to side panel 16 and door panel 22 using rivets 25 or another means of mechanical attachment or adhesion. In alternate embodiments, hinge 24 is formed as a piano-type hinge, sometimes using a non-polymer material such as a metal or a metal alloy. In further embodiments, hinge 24 comprises a number of discrete structures such as hinge pins or hinge plates, or both, and is formed either of a polymer or a metal or metal alloy.

Figure 3A:
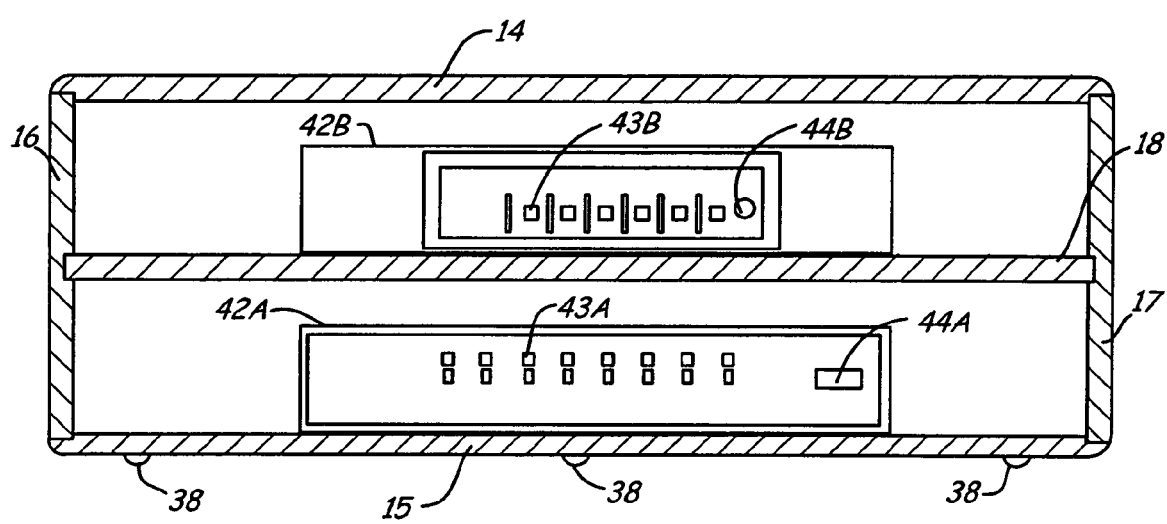
FIG. 3A is a front elevation view of the enclosure in FIG. 1A, in an embodiment used to secure two exemplary communication devices.
Figure 3B:
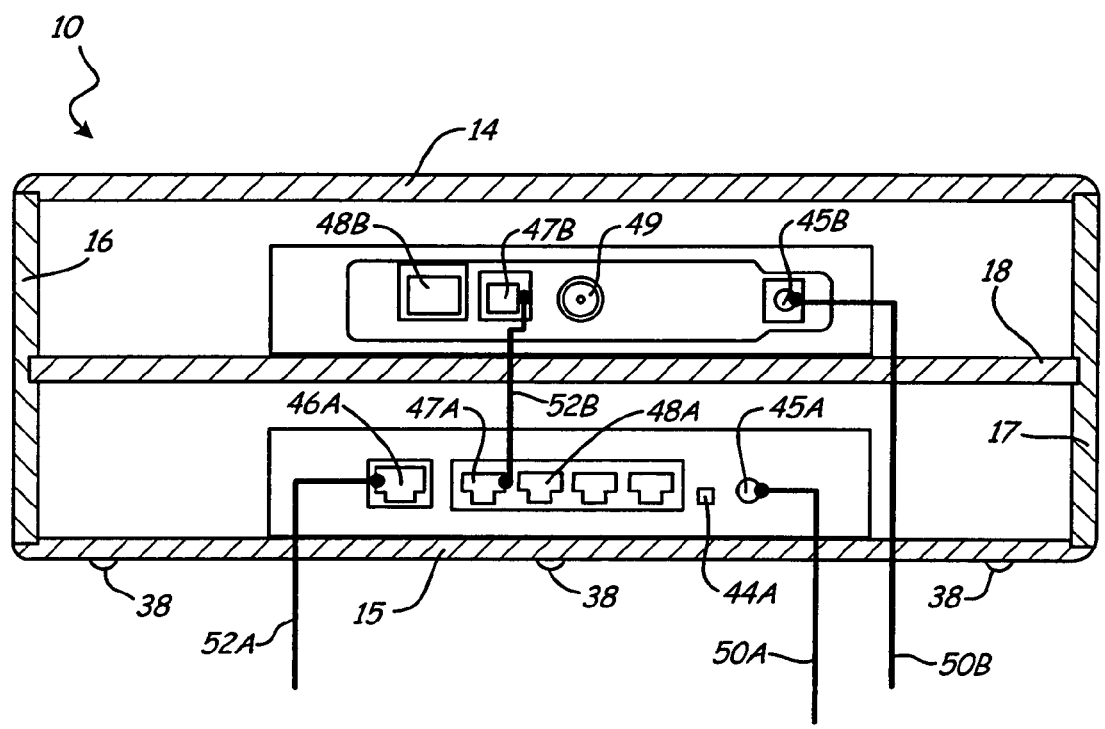
FIG. 3B is a rear elevation view of the enclosure in FIG. 3A.

FIGS. 3A and 3B are front and rear elevation view of enclosure 10, showing communication devices 40A and 40B. Enclosure 10 comprises top and bottom panels 14 and 15, side panels 16 and 17 and shelf/divider 18, as described above. Front panel 12 and door 20 with lock 26 are not shown in these views (see FIGS. 1A, 1B, 2A and 2B, above).

In the particular embodiment of FIGS. 3A and 3B, communication device 40A (bottom) is a router comprising router housing 42A with indicators/status lights 43A and control mechanism 44A on the front (FIG. 3A), and power connector 45A and router ports 46A, 47A and 48A on the rear (FIG. 3B). Communication device 40B (top, on shelf 18) is a modem comprising modem housing 42B with indicators/status lights 43B and control mechanism 44B on the front (FIG. 3A), and power connector 45B and modem ports 47B and 48B on the rear (FIG. 3B). Alternatively, either device 40A or device 40B is a switch with similar connections, including available ports such as unused ports 46A, 47A, 48A, 47B or 48B.

Power cables 50A and 50B are connected to power inputs 45A and 45B on router 40A and modem 40B, respectively. External data cable 52A, for example a T10/100 cable connects a card reader or other electronic transaction device to first (primary) router port 46A on and router 40A, for example using an RJ45 connector. Internal communication cable 52B connects router 40A to modem 40B, for example from second (auxiliary) router port 47A to modem port 47B, using an FJ45 connector or another standard connector configuration.

One or more control access apertures (see FIGS. 1A and 1B) provide access to particular control mechanisms on router 40A and modem 40B, for example on/off switch 44A on the front of router 40A or reset button 44B on modem 40B, or to other control mechanisms located on the front, back or sides of devices 40A and 40B.

The use of transparent materials in enclosure 10 provides interior views of at least the front and rear of devices 40A and 40B, allowing the location, cabling configuration and operational status of the devices to be determined while secured within enclosure 10. In the particular embodiment of FIGS. 3A and 3B, for example, enclosure 10 provides interior views showing the location of housings 42A and 42B, the operational condition of data/status lights 43A and 43B, power connectors 45A and 45B, and data ports 46A, 46B, 47A, 47B and 48A. In particular, enclosure 10 allows users to verify that power and data cables 50A, 50B, 52A and 52B are properly connected to devices 40A and 40B, and that no unauthorized data connections have been made to auxiliary ports 48A and 48B.

Auxiliary (or unused) data ports 48A and 48B are not required for legitimate retail transactions and other authorized uses of router 40A and modem 40B, but are provided to accommodate additional purposes such as debugging, setup and system expansion. Enclosure 10 secures devices 40A and 40B by physically blocking access to auxiliary ports 48A and 48B as described above, and by providing an interior view of devices 40A and 40B so that any unauthorized connections or uses can be detected.

In addition to preventing unauthorized general-purpose access like internet surfing, enclosure 10 also prevents access to specific data related to PCI DSS requirements. In wholesale or retail commercial environments, for example, devices 40A and 40B are routinely utilized to transmit sensitive data such as credit card and other account numbers, account balances, account names, routing numbers and billing addresses. In medical, legal, educational and other professional environments, the issues expand to include proprietary sales and technical information, trade secrets, medical records, litigation work product, academic records, performance reviews and other forms of private or legally privileged information.

In order to limit employee access to sensitive data, particularly credit card data the PCI DSS requirements provide rules for employee access and proximity. Enclosure 10 addresses these requirements by restricting physical access to wireless access points, gateways, network jacks, including handheld devices stored within enclosure 10, and physically securing networking and communications hardware.

In typically applications, communication devices 40A and 40B encrypt sensitive information before transmission over the internet or other communication system, restricting access to the data. In some of these applications, however, the data are encrypted by router 40A before transmission to modem 40B, but are not encrypted within external data cable 52A. In other applications, the data are encrypted, but the key has been copied or stolen from a local hardware system.

In either situation, auxiliary ports 48A or 48B pose a substantial security risk for unauthorized access. In addition, access of this form typically takes place in parallel with legitimate data transfers such as actual retail purchases and authorized file access, and is sometimes undetected for substantial periods of time. This is particularly true in prior art designs using metal or other opaque materials, which obscure auxiliary ports 48A and 48B from view and make it difficult to determine when unauthorized data connections have been made. Enclosure 10 closes this security loophole by physically preventing access to unused and auxiliary ports, and by providing internal views of devices 40A and 40B to verify that no unauthorized data connections have been made. At the same time, enclosure 10 provides the cabling and control access required for legitimate data transfers, and troubleshooting functions, while maintaining a desired range of temperature and humidity conditions.

The present invention has been described with reference to preferred embodiments, but the terminology used is for the purposes of description, not limitation. Workers skilled in the art will recognize that changes may be made in form and detail without departing from the spirit and scope of the invention.

The invention claimed is:

1. An enclosure comprising: first and second sections formed of a transparent material; a plurality of wall sections joined to the first section to form the enclosure; a hinge connecting the second section to one of the plurality of wall sections to form a door in the enclosure; a cable access located to allow authorized power and data connections within the enclosure when the door is in an open position and sized to prevent unauthorized data connections within the enclosure when the door is in a closed position; a lock to secure the enclosure by locking the door in the closed position; and a control access located to access a control mechanism inside the enclosure and sized to prevent entry of a cable connector through the enclosure when the door is in the closed position; wherein the cable access is located to allow the authorized power and data connections by providing a cable feed-through when the door is in the open position; and wherein the cable access is sized to prevent the unauthorized data connections by preventing entry of the cable connector when the door is in the closed position.

2. The enclosure of claim 1, wherein the cable access is sized to prevent entry of a 10/100 type crossed network cable connector when the door is in the closed position.

3. The enclosure of claim 1, wherein the plurality of wall sections is formed of the transparent material forming the first and second sections.

4. The enclosure of claim 3, wherein the transparent material comprises a transparent thermoplastic.

5. The enclosure of claim 4, wherein the wall sections are joined to the first section to form the enclosure by means of rabbet joints.

6. The enclosure of claim 4, wherein the hinge comprises a continuous living hinge formed of a resilient, flexible and fatigue-resistant polymer.

7. The enclosure of claim 4, further comprising vent holes formed in the plurality of wall sections.

8. A secure enclosure for a communication device, the enclosure comprising: top, bottom and side panels formed of a lightweight, durable thermoplastic; front and rear panels formed of the lightweight durable thermoplastic in transparent form; a hinge for forming a door by hinging one of the front panel and the rear panel to one of the top, bottom and side panels; a cable aperture for making connections to the communication device when the door is open; a lock for locking the door to prevent connections to the communication device when the door is closed; and a control aperture located to access a control mechanism on the communication
device and sized to prevent entry of a cable connector when the door is in the closed position; wherein the cable aperture is located to allow power and data connections to the communication device by providing a cable feed-through when the door is in the open position; and wherein the cable aperture is sized to prevent entry of the cable connector when the door is in the closed position.

9. The enclosure of claim 8, wherein the cable aperture does not admit a USB-type connector when the door is closed.

10. The enclosure of claim 8, wherein each of the top, bottom and side panels are further formed of the lightweight, durable thermoplastic in transparent form.

11. The enclosure of claim 10, wherein the lightweight, durable thermoplastic comprises polycarbonate.

12. The enclosure of claim 8, wherein the lock comprises a keyless locking mechanism.

13. A system comprising:
a communication device comprising an indicator light, a power input, a first data port, a second data port and a control mechanism; and
an enclosure for securing the communication device, the enclosure comprising:
a plurality of wall panels joined together to form the enclosure;
a door panel hinged to the enclosure to form a door;
a cable aperture sized and located to allow connections to the power input and the first data port when the door is unlocked, and to prevent access to the second data port when the door is locked;
a lock for securing the communications device by locking the door; and
a control aperture formed in the enclosure to access the control mechanism when the door is locked;
wherein the door panel and at least one of the plurality of wall panels are transparent, such that the indicator light, the power input, the first data port, the second data port and the control mechanism are visible from outside the enclosure.

14. The system of claim 13, wherein the cable aperture and the control aperture are sized to prevent entry of a USB-type cable connector when the door is locked.

15. The system of claim 13, wherein the plurality of wall panels and the door panel are formed of a polycarbonate material having vent holes for fluid flow.

16. The system of claim 15, wherein the transparent door is hinged to the enclosure by means of a living hinge formed of polypropylene.

* * * * *